US012732148B2

(12) United States Patent
Henderson

(10) Patent No.: US 12,732,148 B2

(45) **Date of Patent: *Sep. 8, 2026**

(54) DYNAMIC AUDIO NORMALIZATION PROCESS

(71) Applicant: Comcast Cable Communications, LLC, Philadelphia, PA (US)

(72) Inventor: Daisy Henderson, Englewood, CO (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/596,259

(22) Filed: Mar. 5, 2024

(65) Prior Publication Data

US 2024/0291456 A1 Aug. 29, 2024

Related U.S. Application Data

(63) Continuation of application No. 18/066,074, filed on Dec. 14, 2022, now Pat. No. 11,955,940, which is a (Continued)

(51) Int. Cl.

*H03G 7/00* (2006.01)
*H03G 3/30* (2006.01)
*H04N 21/81* (2011.01)

(52) U.S. Cl.

CPC ........... *H03G 7/007* (2013.01); *H03G 3/3052* (2013.01); *H03G 3/3089* (2013.01); *H04N 21/8106* (2013.01); *H04N 21/812* (2013.01)

(58) Field of Classification Search

CPC .... H03G 7/007; H03G 3/3052; H03G 3/3089; H04N 21/8106; H04N 21/812

See application file for complete search history.

(56) References Cited

U.S. PATENT DOCUMENTS 5,778,077 A 7/1998 Davidson
5,832,444 A 11/1998 Schmidt (Continued)

FOREIGN PATENT DOCUMENTS

CA 2208987 A1 7/1997
EP 1942607 A2 7/2008

(Continued)

OTHER PUBLICATIONS

Chien et al., Prevalence of Hearing Aid Use Among Older Adults in the United States, Arch. Intern. Med., Feb. 13, 2012: 172(3), 292-293.

(Continued)

*Primary Examiner* — Joseph Saunders, Jr.

(74) *Attorney, Agent, or Firm* — BakerHostetler

(57) ABSTRACT

Methods, systems, and apparatuses are described herein for improved processing audio in a video stream. A system may split audio in a frame of video content into multiple bands based on their audio levels. The system may then dynamically compress and dynamically normalize the audio level in each band. When dynamically compressing the bands, the system may determine, based on stored information, what audio level range is acceptable for an end user and may smooth and maintain the ranges of the audio to be within the acceptable range. The system may include the dynamically normalized and dynamically compressed frames as a second audio track in the video content. A computing device receiving the video content may select the second audio track during playback. If an end user selects the second audio track, the video is delivered with the modified sound of the second audio track.

20 Claims, 6 Drawing Sheets

500

Related U.S. Application Data continuation of application No. 17/247,890, filed on Dec. 29, 2020, now Pat. No. 11,558,022, which is a continuation of application No. 16/504,062, filed on Jul. 5, 2019, now Pat. No. 10,911,013.

(60) Provisional application No. 62/694,156, filed on Jul. 5, 2018.

(56) References Cited

U.S. PATENT DOCUMENTS

| | | | |
|---|---|---|---|
| 6,081,291 | A | 6/2000 | Ludwig, Jr. |
| 6,226,616 | B1 | 5/2001 | You et al. |
| 6,359,938 | B1 | 3/2002 | Keevill et al. |
| 6,614,366 | B2 | 9/2003 | Luby |
| 6,765,931 | B1 | 7/2004 | Rabenko et al. |
| 6,873,709 | B2 | 3/2005 | Hou |
| 6,912,209 | B1 | 6/2005 | Thi et al. |
| 6,972,786 | B1 | 12/2005 | Ludwig |
| 7,023,868 | B2 | 4/2006 | Rabenko et al. |
| 7,415,120 | B1 | 8/2008 | Vaudrey et al. |
| 7,838,755 | B2 | 11/2010 | Taub et al. |
| 8,320,520 | B2 | 11/2012 | Kondo |
| 8,764,651 | B2 | 7/2014 | Tran |
| 9,171,552 | B1 | 10/2015 | Yang |
| 9,559,651 | B2 | 1/2017 | Baumgarte et al. |
| 2002/0061012 | A1 | 5/2002 | Thi et al. |
| 2002/0075965 | A1 | 6/2002 | Claesson et al. |
| 2003/0023429 | A1 | 1/2003 | Claesson et al. |
| 2005/0078840 | A1 | 4/2005 | Riedl |
| 2008/0147728 | A1 | 6/2008 | Reichert et al. |
| 2008/0243518 | A1 | 10/2008 | Oraevsky et al. |
| 2009/0060209 | A1* | 3/2009 | Takeishi .................. H04S 7/307 381/17 |
| 2009/0074209 | A1 | 3/2009 | Thompson et al. |
| 2010/0191525 | A1 | 7/2010 | Rabenko et al. |
| 2011/0181597 | A1 | 7/2011 | Cardno et al. |
| 2011/0294566 | A1 | 12/2011 | Cardno et al. |
| 2014/0143064 | A1 | 5/2014 | Tran |
| 2014/0297291 | A1 | 10/2014 | Baumgarte |
| 2015/0117685 | A1 | 4/2015 | Reiss et al. |
| 2016/0072467 | A1 | 3/2016 | Seefeldt |
| 2016/0287166 | A1 | 10/2016 | Tran |
| 2017/0256267 | A1 | 9/2017 | Disch et al. |
| 2018/0133583 | A1 | 5/2018 | Tran et al. |

FOREIGN PATENT DOCUMENTS

| | | | |
|---|---|---|---|
| GB | 2308526 | A | 6/1997 |
| JP | 62-085939 | | 11/1988 |
| KR | 2001-0089278 | | 9/2001 |
| KR | 10-2005-0043800 | A | 5/2005 |
| KR | 10-0598662 | | 7/2006 |
| WO | 2000/062501 | A2 | 10/2000 |
| WO | 2000/079520 | A1 | 12/2000 |
| WO | 2002/023824 | A2 | 3/2002 |

OTHER PUBLICATIONS

Statistic Brain Research Institute, Cable TV Subscriber Statistics, https://www.statisticbrain.com/tv-cable-subscriber-statistics/, webpage accessed Jul. 7, 2020.

US Patent Application filed on Jul. 5, 2019, entitled “Dynamic Audio Normalization Process”, U.S. Appl. No. 16/504,062.

US Patent Application filed on Dec. 14, 2022, entitled “Dynamic Audio Normalization Process”, U.S. Appl. No. 18/066,074.

US Patent Application filed on Dec. 29, 2020, entitled “Dynamic Audio Normalization Process”, U.S. Appl. No. 17/247,890.

* cited by examiner

600

DYNAMIC AUDIO NORMALIZATION PROCESS

CROSS REFERENCE TO RELATED APPLICATIONS

This application is a continuation of U.S. application Ser. No. 18/066,074, filed Dec. 14, 2022, now U.S. Pat. No. 11,955,940, which is a continuation application of U.S. application Ser. No. 17/247,890, filed Dec. 29, 2020, now U.S. Pat. No. 11,558,022, which is a continuation application of U.S. application Ser. No. 16/504,062, filed Jul. 5, 2019, now U.S. Pat. No. 10,911,013, which claims the benefit of U.S. Provisional Patent Application No. 62/694,156, filed Jul. 5, 2018, each of which is incorporated by reference in its entirety as if fully set forth herein.

BACKGROUND

Video content distributed via broadcast networks or streamed via Internet Protocol (IP) based networks often contains sudden volume changes. Further, dynamic ad insertion (DAI) techniques used by content distributors often cause advertisements to be at a much higher volumes than the rest of the content being viewed. As a result, people with posttraumatic stress disorder (PTSD), hearing aid users, and people with autism and/or other disabilities may have very unpleasant viewing experiences.

Manual volume adjustment and conventional audio processing techniques fail to overcome these viewing issues. For example, conventional techniques for dynamically normalizing audio results in all sounds being enhanced while conventional techniques for compressing may cause clipping and may reduce the quiet audio portions to inaudible levels. Other conventional systems normalize audio based only merely predefined range values. Further, there are currently no options to mitigate the volume changes with DAI, other than having the user physically mute the advertisement.

Accordingly, there is a need for improved techniques for modifying audio in a video stream in order to enable a more pleasant experience for all users viewing video content.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure Methods, systems, and apparatuses are described herein for improved processing audio in a video stream. Each frame in an audio track may be dynamically normalized and dynamically compressed to produce acceptable audio levels for the end user. A system configured for video processing may receive video content and split the audio in a frame of the video content into multiple bands based on their audio levels. The system may then dynamically compress and dynamically normalize the audio level in each band. When dynamically compressing the bands, the system may determine, based on stored information, what audio level range is acceptable for the end user and may smooth and maintain the ranges of the audio to be within the acceptable range. The system may include the dynamically normalized and dynamically compressed frames as a second audio track in the video content. A computing device receiving the content may then select the second audio track during playback of the video content. As a result, no processing is required by the end-user computing device in order to play back the second audio track. If an end user selects the second audio track, the video is delivered with the modified sound of the second audio track.

Other features of the methods, systems, and apparatuses are described below. The features, functions, and advantages can be achieved independently in various examples or may be combined in yet other examples, further details of which can be seen with reference to the following description and drawings.

BRIEF DESCRIPTION OF THE DRAWINGS

The following detailed description is better understood when read in conjunction with the appended drawings. For the purposes of illustration, examples are shown in the drawings; however, the subject matter is not limited to the specific elements and instrumentalities disclosed. In the drawings.

DETAILED DESCRIPTION OF ILLUSTRATIVE EMBODIMENTS

Figure 1:
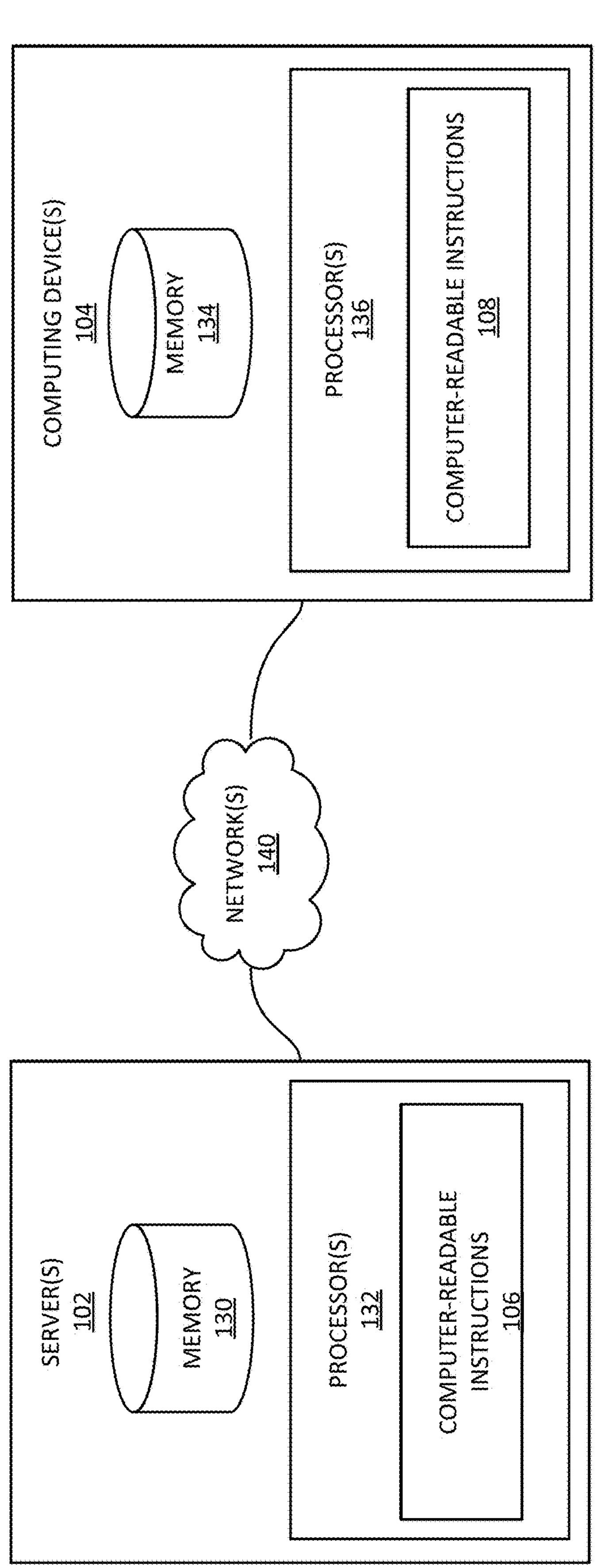
FIG. 1 illustrates a diagram of an example system.

Methods, systems, and apparatuses are described herein for the improved processing of audio in a video stream. The audio content in the video stream may be processed to remove noise spikes in order to generate audio levels that may be more acceptable to users with posttraumatic stress disorder (PTSD), hearing aid, or disabilities such as autism. This technique performs dynamic range compression (e.g., reducing the audio level of loud sounds and amplifying the audio level of quiet sounds) and normalization of the audio (e.g., adjusting the audio level gain across a portion of audio), based on the content of the audio, in order to reduce loud noises and enhance quiet portions of the audio track while still maintaining the integrity of the audio track. The audio content may be normalized and compressed on a frame-by-frame basis. A second audio track comprising the normalized and compressed audio may be generated by a server-side system, which may be selected by a user instead of the original audio track. The user may toggle on and off the second audio track comprising the normalized/compressed audio.

This technique may be implemented in systems and computing devices configured to process video. This technique may also be implemented in systems, such as emergency alert systems, to reduce large spikes in decibel changes at the end user device during emergency alert system broadcasts. This technique may also be applied to audio being recorded by a client-side application.

In one example, a system configured for video processing may receive video content from a video source. The system may then determine transitions of the audio in a frame of the video content. The system may then split the audio in the frame into multiple bands (e.g., four bands) based on their decibel levels. The system may then look at each separate band in the frame and may dynamically compress the range of the loudest band (e.g., the band with highest decibel level) in that frame. The system may, based on the amount of compression of the loudest band, dynamically compress the ranges of the other separate bands in that frame. When dynamically compressing the bands, the system may determine what audio level range is acceptable for the end user and may smooth and maintain the ranges of the audio to be within the acceptable range. The data used to determine the acceptable audio level range may be based on information from sources such as national hearing data, audio levels from within revisions of the Commercial Advertisement Loudness Mitigation (CALM) Act, hearing aid data, information on PTSD triggers, as well as audio standards on various platforms (TV, headphone, laptop, and external speakers).

The system may also dynamically normalize the separate bands in the frame in order to maintain the integrity of the audio track. For example, softer bands dealing with speech may be increased, while deeper, louder bands may be decreased.

The system may include the dynamically normalized and dynamically compressed frames as a second audio track in the stream. A computing device receiving the content from a content delivery network (CDN) may then select the second audio track during playback of the content. As a result, no processing is required by the end-user computing device in order to play back the second audio track. If an end user selects the second audio track, the video is delivered with the modified sound of the second audio track.

FIG. 1 illustrates a diagram of an example high-level system 100 configured for dynamically normalizing and dynamically compressing each frame in an audio track to produce acceptable audio levels in accordance with one or more embodiments described herein. In the example of FIG. 1, the system 100 may include one or more computing device(s) 104. Computing device(s) 104 may be configured to communicate with one or more server(s) 102. Computing device(s) 104 may be configured to communicate with other computing devices via server(s) 102 and/or according to a peer-to-peer architecture and/or other architectures. Users may access system 100 via computing device(s) 104.

Server(s) 102 and/or computing device(s) 104 may include transmitters, receivers, and/or transceivers enabling the server(s) 102, and/or computing device(s) 104 to be operatively linked via one or more electronic communication links. For example, such electronic communication links may be established, at least in part, via a network 140 such as the Internet and/or other networks. The electronic communication links may enable wired or wireless communications among the server(s) 102 and/or computing device (s) 104 using technologies such as coaxial cable, Ethernet, fiber optics, microwave, satellite, Public Switched Telephone Network (PTSN), DSL (Digital Subscriber Line), Broadband over Power Lines (BPL), wireless local area network (WLAN) technology such as Institute of Electrical and Electronics Engineers (IEEE) 802.11 technology, wireless cellular technology, Bluetooth, or any other appropriate technologies. It will be appreciated that the example system 100 of FIG. 1 is not intended to be limiting, and that the scope of this disclosure includes implementations in which server(s) 102 and/or computing device(s) 104 may be operatively linked via some other communication media.

Server(s) 102 may be configured by computer-readable instructions 106. Computer-readable instructions may include one or more instruction modules. The instruction modules may include computer program modules. Processor (s) 132 may be configured to execute the computer-readable instructions 106, and perform the procedures in accordance with the embodiments described herein. By way of non-limiting example, the server 102 may include any system that is programmed to transmit or access content consistent with the description herein, and may comprise, for example, a video/audio server, a content delivery network (CDN), a cable head end, or any other suitable system or other computing platform. Server(s) 102 include a memory 130, and one or more processors 132, and/or other components. Server(s) 102 may include communication interfaces, lines, or ports to enable the exchange of information with network 140 and/or other computing platforms. The illustration of server(s) 102 in FIG. 1 is not intended to be limiting. Server(s) 102 may include a plurality of hardware, software, and/or firmware components operating together to provide the functionality attributed herein to server(s) 102. For example, server(s) 102 may be implemented by a cloud of computing platforms operating together as server(s) 102. The memory 130 may comprise non-transitory storage media that electronically stores information, such as, for example, the computer-readable instructions 106. Processor(s) 132 may be configured to provide information processing capabilities in server(s) 102.

Computing device(s) 104 in accordance with the various embodiments described herein may include a memory 134, and one or more processors 136, and/or other components. Computing device(s) 104 may be configured by computer-readable instructions 108. Computer-readable instructions 108 may include one or more instruction modules. The instruction modules may include computer program modules. The instruction modules may include code that calls application programming interfaces (APIs) associated with a plurality of other applications and computing platforms. Processor(s) 136 may be configured to execute the computer-readable instructions 108, respectively and perform the procedures in accordance with the embodiments described herein. By way of non-limiting example, the computing device 104 may comprise one or more of a set-top box, a wireless gateway, a desktop computer, a laptop computer, a handheld computer, a tablet computing platform, a netbook, a smartphone, a gaming console, and/or other computing platforms. Computing device(s) 104 may include communication interfaces, lines, or ports to enable the exchange of information with network 140 and/or other computing platforms. The illustration of computing device (s) 104 in FIG. 1 is not intended to be limiting. Computing device(s) 104 may include a plurality of hardware, software, and/or firmware components operating together to provide the functionality attributed herein to computing device(s) 104. For example, computing device(s) 104 may be implemented by a cloud of computing platforms operating together as computing device(s) 104. The memory 134 may comprise non-transitory storage media that electronically stores information, such as, for example, the computer-readable instructions 108. Processor(s) 136 may be configured to provide information processing capabilities in computing device(s) 104.

Figure 2:
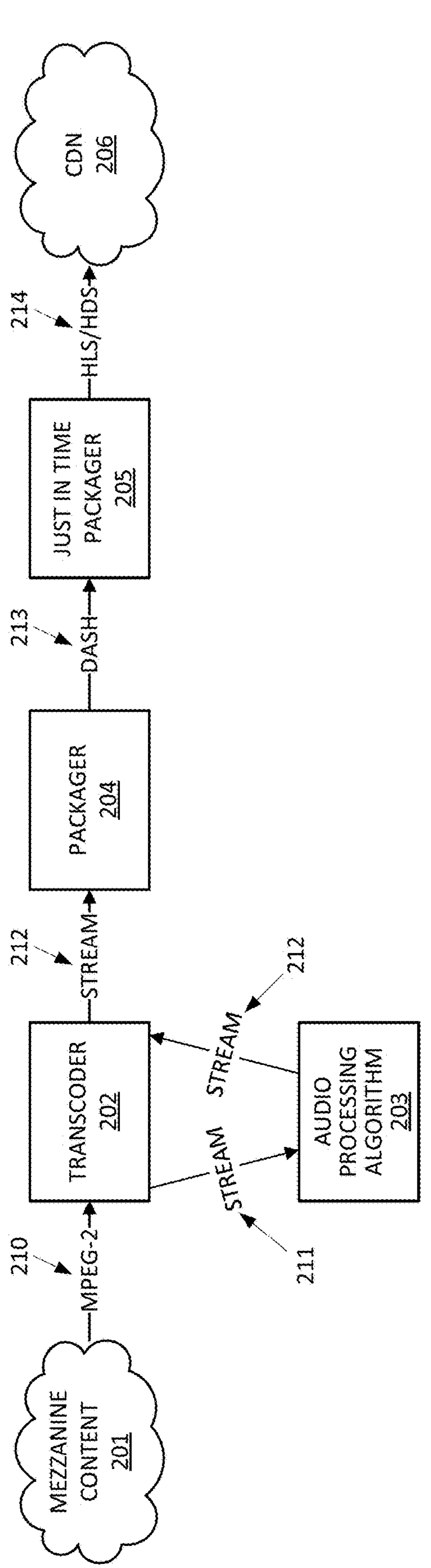
FIG. 2 is a diagram of another example system.

FIG. 2 is a diagram of an example system 200 configured for dynamically normalizing and dynamically compressing each frame in an audio track to produce acceptable audio levels in accordance with one embodiment, which may be used in combination with any of the embodiments described herein. The example system 200 may be implemented, for example, in the server 102 of FIG. 1.

In the example system of FIG. 2, the system 200 may receive mezzanine content 201 from, for example, a broadcast network. The mezzanine content 201 may comprise, for example, linear real time video that is being broadcasted on the broadcast network. A transcoder 202 may receive a stream comprising the mezzanine content 201 in, for example, an MPEG-2 stream 210. The transcoder 202 may perform a digital-to-digital conversion on the MPEG-2 stream 210 to convert the MPEG-2 stream 210 to stream 211. Stream 211 may comprise audio and visual data in another video format such as, for example, an MPEG-4 stream.

Stream 211 may then be sent to an audio processing algorithm 203. The audio processing algorithm 203 may comprise, for example, an FFmpeg audio filter configured to process audio in stream 211 during the transcode step of the video pipeline to produce a second track of the audio.

The audio processing algorithm 203 may reference a manifest file associated with the stream 211 and look ahead an amount of time in the stream 211. For example, the audio processing algorithm 203 may look 500 ms ahead in the manifest file and determine the transitions of the audio at that frame. If the audio has not yet been normalized, the audio processing algorithm 203 may dynamically normalize the audio in that frame. The audio processing algorithm 203 may then split the audio in that frame into multiple bands (e.g., four bands) based on their decibel levels in order to achieve a modified Linkwitz-Riley crossover. The audio processing algorithm 203 may then look at each separate band in that frame and may dynamically compress the range of the loudest band (i.e. band with highest decibel level) in that frame. Then based on the amount of compression of the loudest band, the audio processing algorithm 203 may dynamically compress the ranges of the other separate bands in that frame.

The audio processing algorithm 203 may apply a 2d Gaussian filter to smooth and maintain range within an acceptable audio level range when dynamically compressing the bands. The data used to determine the acceptable audio level ranges may be determined based on information from a plurality of sources. For example, the acceptable audio level ranges may be based on national hearing data, audio levels from within revisions of the CALM Act, hearing aid data, information on PTSD triggers, as well as audio standards on various platforms (TV, headphone, laptop, and external speakers).

The audio processing algorithm 203 may dynamically normalize the separate bands in the frame in order to maintain the integrity of the audio track. For example, the audio processing algorithm 203 may increase the softer bands dealing with speech and decrease the range on deeper, louder bands.

The audio processing algorithm 203 may then determine whether the dynamically normalized and dynamically compressed audio levels in the frame comply with the system 200 settings that define the acceptable audio level ranges. If the audio processing algorithm 203 determines that the audio levels in the frame do not comply with the settings that define the acceptable audio level ranges, the audio filter may repeat the steps of dynamically normalizing each separate band in the frame and then dynamically compressing the ranges of each separate band.

The audio processing algorithm 203 may then process the next frame identified in the manifest file. The audio processing algorithm 203 may dynamically normalize the audio in the second frame. The audio processing algorithm 203 may look at the audio levels of each separate band in the first frame and may dynamically compress the ranges of the other separate bands in second frame based on the levels in the first frame. The audio processing algorithm 203 may then dynamically normalize the separate bands in the second frame in order to maintain the integrity of the audio track. For example, the audio processing algorithm 203 may increase the softer bands dealing with speech and decrease the range on deeper, louder bands. The audio processing algorithm 203 may then determine whether the dynamically normalized and dynamically compressed audio levels in the second frame comply with the system 200 settings that define the acceptable audio level ranges. If the audio processing algorithm 203 determines that the audio levels in the second frame do not comply with the settings that define the acceptable audio level ranges, the audio filter may repeat the steps of dynamically normalizing each separate band in the frame and then dynamically compressing the ranges of each separate band. The audio processing algorithm 203 then repeats this processing on each successive frame identified in the manifest.

Once the audio in frames identified in the manifest have been dynamically normalized and dynamically compressed, the audio processing algorithm 203 may include the dynamically normalized and dynamically compressed frames as a second audio track in stream 212. Stream 212 may comprise the video, the first audio track, the second audio track, the original manifest file, and a modified manifest file. Stream 212 may be in a format such as, for example, an MPEG-4 stream. The audio processing algorithm 203 may include a modified manifest file to identify the dynamically normalized and dynamically compressed frames of the second audio track.

The stream 212 comprising the video, the first audio track, the second audio track, the original manifest file, and the modified manifest file may then be sent to the transcoder 202, which may send it to a packager 204. The packager 204 may then segment the transcoded stream 212 into a plurality of segments that comprises alternative segments of content that are encoded in a plurality of bitrates. For example, the transcoded stream 212 comprising the video, the first audio track, and the second audio track may be segmented into high definition (HD) segments (e.g., in 1080p, 1080i, and/or 720p formats) and/or standard definition (SD) segments. A dynamic adaptive streaming over HTTP (DASH) stream 213 may then be sent from the packager 204 to a just in time packager 205. The just in time packager 205 may determine which segments in the DASH stream 213 to deliver to a content delivery network (CDN) 206 based on the capabilities of a computing device receiving the content and the conditions of the network to which the computing device is connected. The just in time packager 205 may then send the determined segments to the CDN 206 in, for example, an HTTP streaming segmented file format such as HTTP live streaming (HLS) or HTTP dynamic streaming (HDS), to then be sent to the computing device receiving the content. For example, the computing device 104 of FIG. 1 may receive the content from the CDN 206.

The computing device receiving the content from CDN 206 may then select the second audio track during playback of the content. As a result, no processing is required by the end-user computing device in order to play back the second audio track. If an end user selects the second audio track, the modified manifest becomes primary and the video is delivered with the modified sound of the second audio track.

The second audio track may be generated by the audio processing algorithm 203 for delivery via a CDN associated with other video sources including but not limited to video on demand (VOD) and video streaming services such as websites and linear real time video.

In another embodiment, the system 200 in the example of FIG. 2 may dynamically normalize and dynamically compress audio in an advertisement. For example, as program content approaches an advertisement, the audio processing algorithm 203 in the example of FIG. 2 may slowly dynamically normalize the audio to a set level, either determined by the audio processing algorithm 203 in previously dynamically normalized and dynamically compressed frames or by the average audio levels of the content that may be detected on the fly. In some embodiments, an incoming SCTE 35 signal may be used as a trigger for the dynamic normalizing process in the content, and the system 200 may then apply and gracefully transition to an advertisement that contains a second, standardized level audio track. This may occur during a hand-off stage at the transcoder level. As the advertisement concludes and content resumes, the system 200 may apply a process similar to the process performed at beginning of the advertisement. The content may start at a level to match that of the advertisement, and then may be dynamically normalized and if needed, compressed, to the desired range of the program (either to a selected audio level range if enabled or full range). As described above, this process may be performed as part of the transcode step to provide seamless integration into the architecture workflow for both VOD and linear content.

Figure 3:
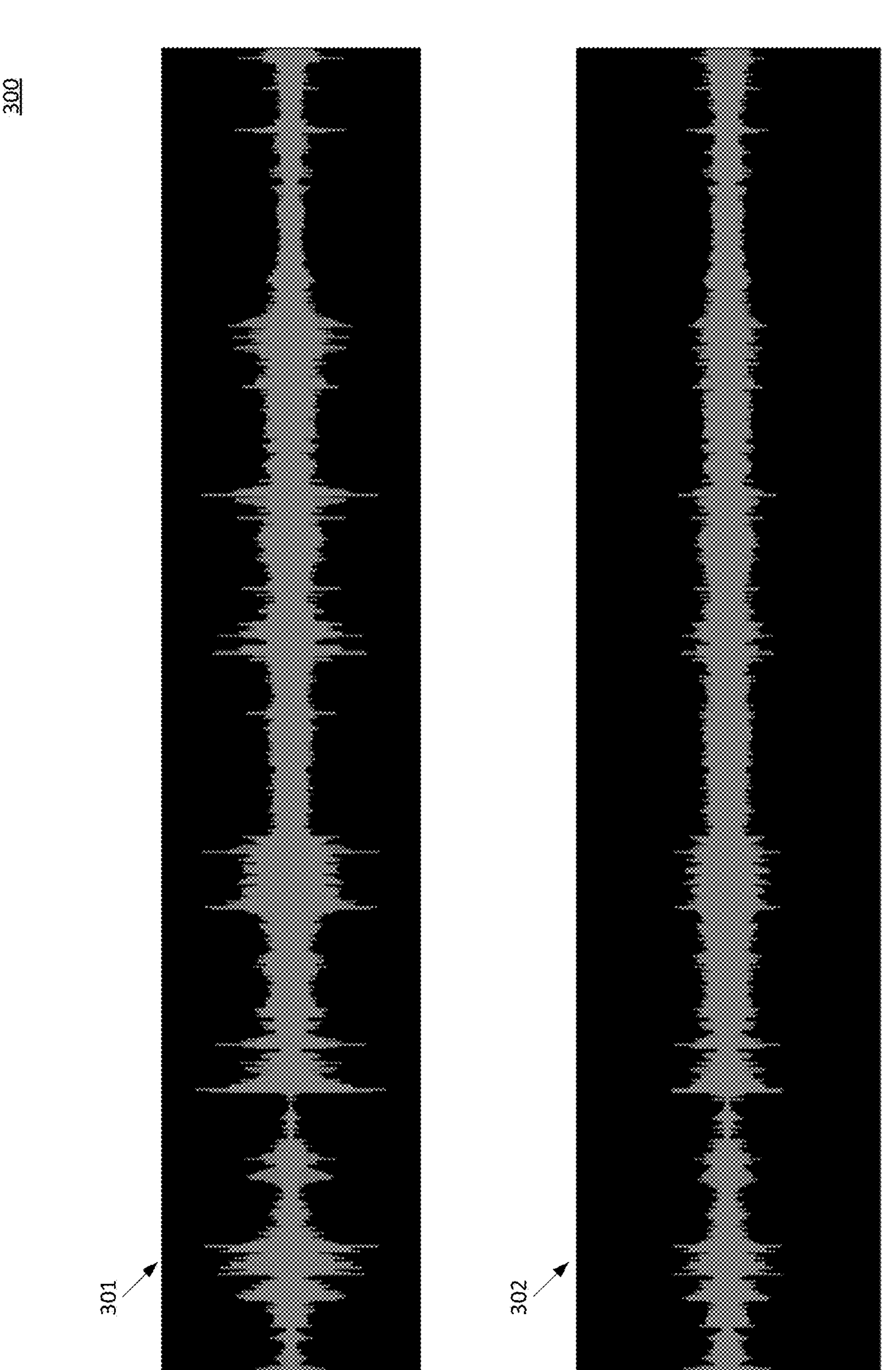
FIG. 3 is an example comparing original, unprocessed audio to audio that has been dynamically normalized and dynamically compressed in accordance with the embodiments described herein.

FIG. 3 is an example 300 comparing the original audio 301 that has not been processed and the second audio track 302 that has been dynamically normalized and dynamically compressed. As shown in the example of FIG. 3, the original audio track 301 comprises a plurality of large noise spikes. However, the second audio track 302 that has been dynamically normalized and dynamically compressed using the techniques described above with respect to FIG. 2 has smoothed out audio by increasing the softer audio in the track and decreasing the range on deeper, louder audio in the track.

Figure 4:
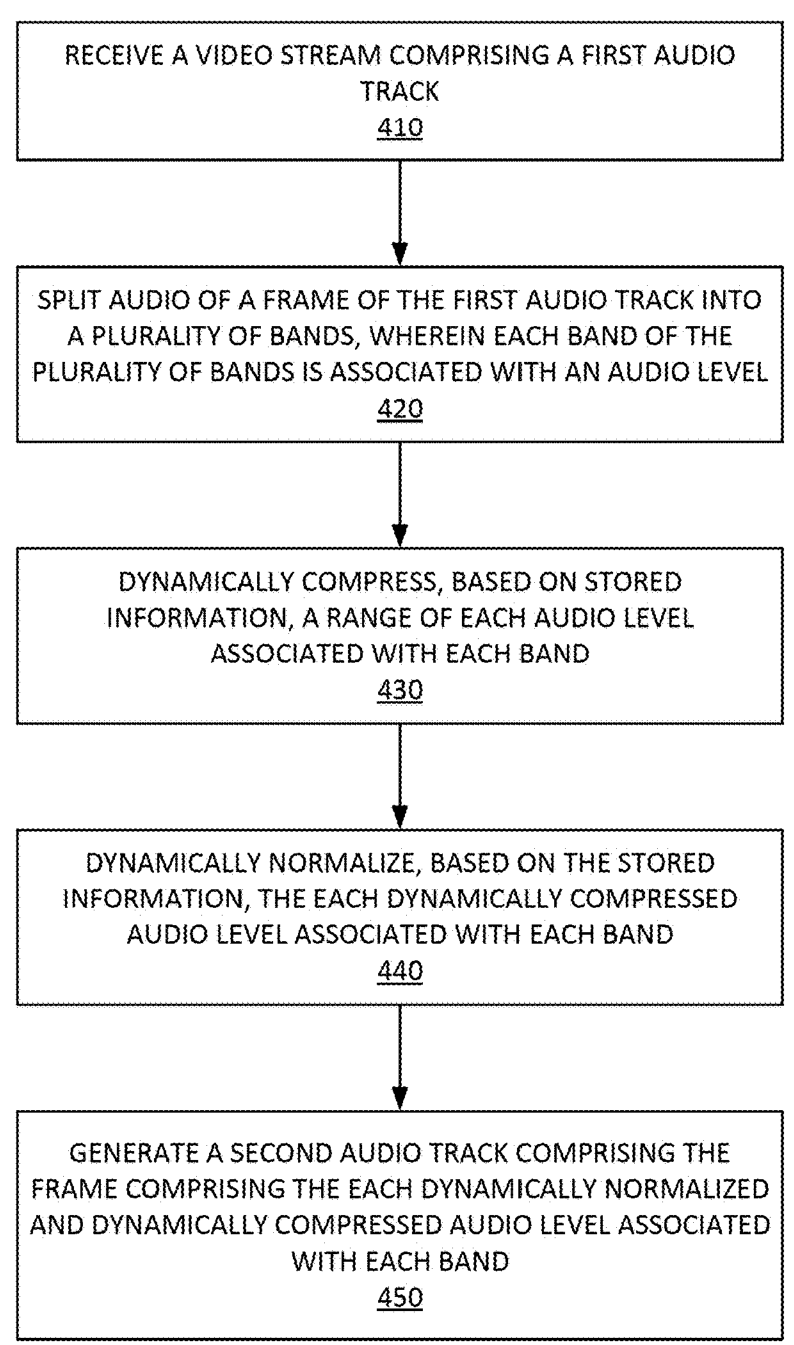
FIG. 4 is an example method.

FIG. 4 is a flow diagram of an example method 400 for dynamically normalizing and dynamically compressing each frame in an audio track to produce acceptable audio levels in accordance with one embodiment, which may be used in combination with any of the embodiments described herein. In the example of FIG. 4 a server, as described herein, may implement the procedure 400. While each step of the procedure 400 in FIG. 4 is shown and described separately, multiple steps may be executed in a different order than what is shown, in parallel with each other, or concurrently with each other. The server may have a memory that has stored thereon computer-readable instructions that, when executed, cause the server to perform steps as described. In some examples, method 400 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 400 in response to instructions stored electronically on an electronic storage medium. The one or more processing devices may include one or more devices configured through hardware, firmware, and/or software to be specifically designed for execution of one or more of the operations of method 400.

At step 410, a video stream comprising a first audio track may be received. The video stream may have been received from a network. At step 420, audio of a frame of the first audio track may be split into a plurality of bands, wherein each band of the plurality of bands is associated with an audio level. The splitting may be based on a transition of the plurality of transitions that was determined based on information, such as a manifest file, associated with the video stream.

At step 430, a range of each audio level associated with each band may be dynamically compressed based on stored information. At step 440, the each dynamically compressed audio level associated with each band may be dynamically normalized based on the stored information. The dynamically compressing and the dynamically normalizing of steps 430 and 440 may have been triggered based on detection of a signal indicating that the frame is associated with advertising content.

The stored information may comprise data associated with one or more acceptable audio level ranges. The one or more acceptable audio level ranges may each be associated with a disability type. It may be determined, based on one or more acceptable audio level ranges, whether the each dynamically normalized and dynamically compressed audio level associated with each band is within an acceptable audio range level of the one or more acceptable audio level ranges, and if not, the dynamically compressing and the dynamically normalizing of steps 430 and 440 may be repeated.

At step 450, a second audio track may be generated comprising the frame comprising the each dynamically normalized and dynamically compressed audio level associated with each band. The second audio track may be sent via a content delivery network to a computing device. Information indicating that either the first audio track or the second audio track is selectable for playback may be sent via the content delivery network to the computing device. The information may comprise a first manifest file associated with the first audio track and a second manifest file associated with the second audio track. A selection of the second audio track for playback may be received via the content delivery network from the computing device and based on a user input.

Figure 5:
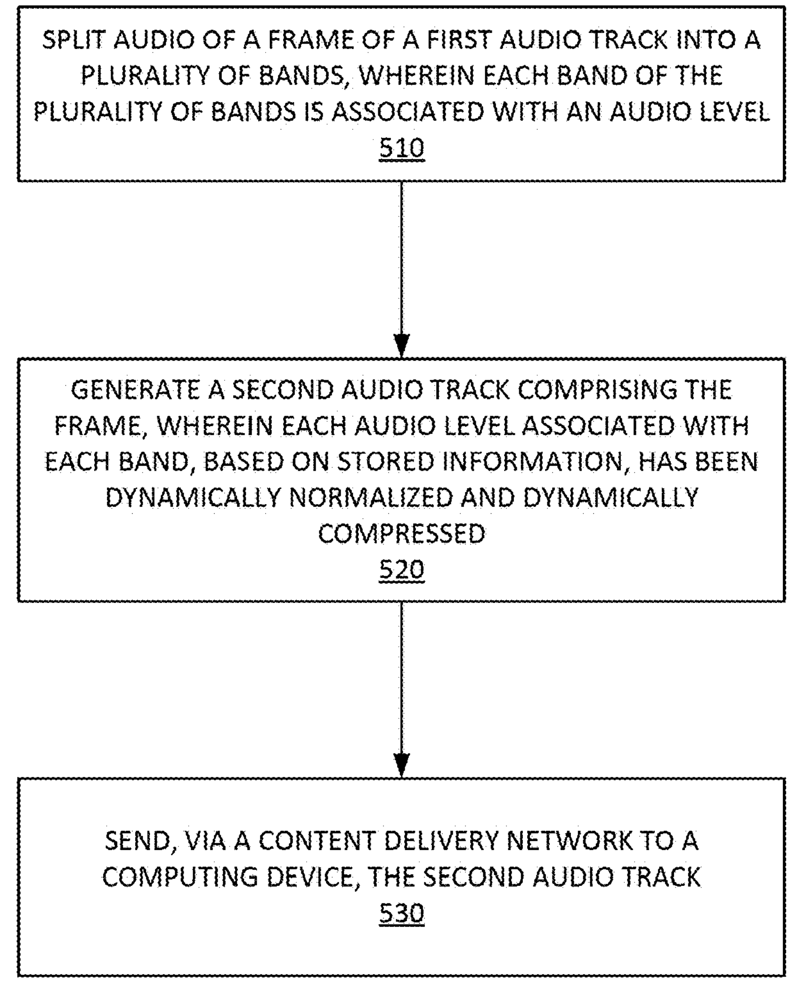
FIG. 5 is an example method.

FIG. 5 is a flow diagram of another example method 400 for dynamically normalizing and dynamically compressing each frame in an audio track to produce acceptable audio levels in accordance with one embodiment, which may be used in combination with any of the embodiments described herein. In the example of FIG. 5 a server, as described herein, may implement the procedure 500. While each step of the procedure 500 in FIG. 5 is shown and described separately, multiple steps may be executed in a different order than what is shown, in parallel with each other, or concurrently with each other. The server may have a memory that has stored thereon computer-readable instructions that, when executed, cause the server to perform steps as described. In some examples, method 500 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 500 in response to instructions stored electronically on an electronic storage medium. The one or more processing devices may include one or more devices configured through hardware, firmware, and/or software to be specifically designed for execution of one or more of the operations of method 500.

At step 510, audio of a frame of a first audio track may be split into a plurality of bands, wherein each band of the plurality of bands is associated with an audio level. The frame may be part of a video stream received from a network. The splitting may be based on a transition of the plurality of transitions that was determined based on information, such as a manifest file, associated with the video stream.

At step 520, a second audio track may be generated comprising the frame, wherein each audio level associated with each band, based on stored information, has been dynamically normalized and dynamically compressed. The stored information may comprise data associated with one or more acceptable audio level ranges. The one or more acceptable audio level ranges may each be associated with a disability type. It may be determined, based on one or more acceptable audio level ranges, whether the each dynamically normalized and dynamically compressed audio level associated with each band is within an acceptable audio range level of the one or more acceptable audio level ranges, and if not, the dynamically compressing and the dynamically normalizing of steps may be repeated.

At step 530, the second audio track may be sent, via a content delivery network to a computing device. Information indicating that either the first audio track or the second audio track is selectable for playback may be sent via the content delivery network to the computing device. The information may comprise a first manifest file associated with the first audio track and a second manifest file associated with the second audio track. A selection of the second audio track for playback may be received via the content delivery network from the computing device and based on a user input.

Figure 6:
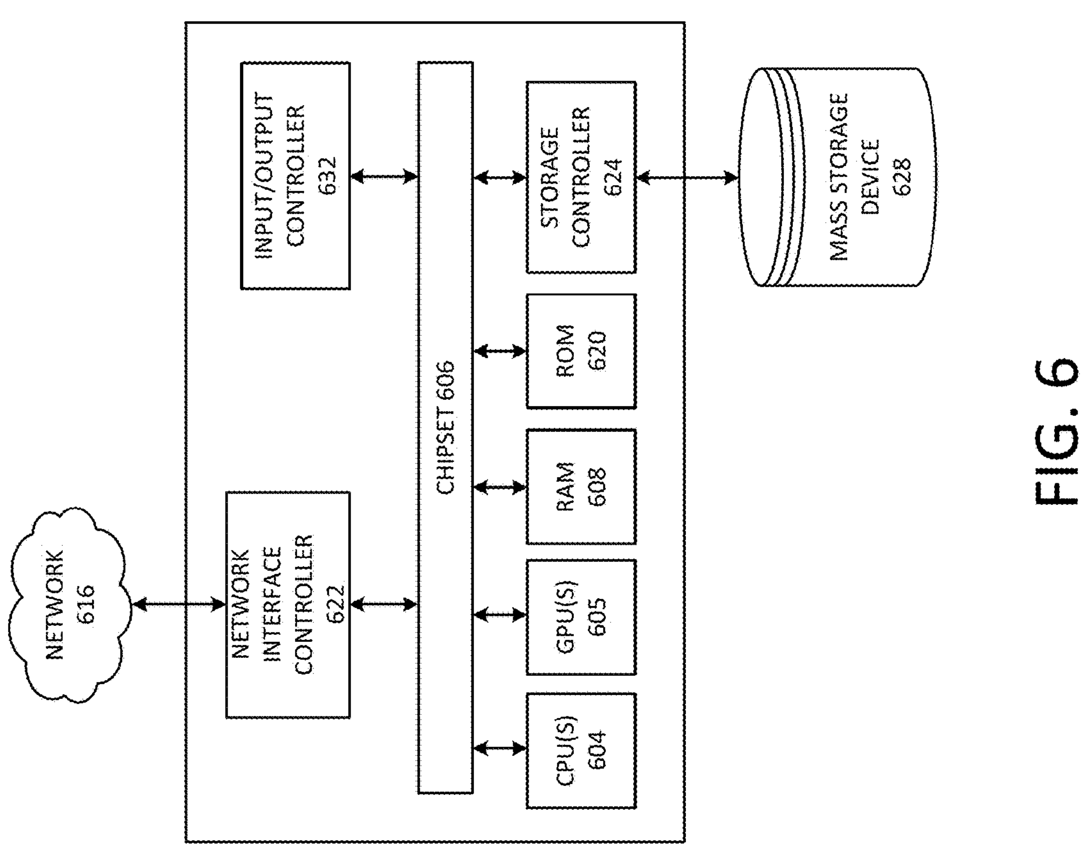
FIG. 6 depicts an example computing device that may be used in various aspects, such as the servers, modules, and/or devices described herein.

FIG. 6 depicts a computing device 600 that may be used in various aspects, such as the servers, modules, and/or devices depicted in FIGS. 1 and 2. With regard to the example architectures of FIGS. 1 and 2, the devices may each be implemented in an instance of a computing device 600 of FIG. 6. The computer architecture shown in FIG. 6 shows a conventional server computer, workstation, desktop computer, laptop, tablet, network appliance, PDA, e-reader, digital cellular phone, or other computing node, and may be utilized to execute any aspects of the computers described herein, such as to implement the methods described in relation to FIG. 4.

The computing device 600 may include a baseboard, or "motherboard," which is a printed circuit board to which a multitude of components or devices may be connected by way of a system bus or other electrical communication paths. One or more central processing units (CPUs) 604 may operate in conjunction with a chipset 606. The CPU(s) 604 may be standard programmable processors that perform arithmetic and logical operations necessary for the operation of the computing device 600.

The CPU(s) 604 may perform the necessary operations by transitioning from one discrete physical state to the next through the manipulation of switching elements that differentiate between and change these states. Switching elements may generally include electronic circuits that maintain one of two binary states, such as flip-flops, and electronic circuits that provide an output state based on the logical combination of the states of one or more other switching elements, such as logic gates. These basic switching elements may be combined to create more complex logic circuits including registers, adders-subtractors, arithmetic logic units, floating-point units, and the like.

The CPU(s) 604 may be augmented with or replaced by other processing units, such as GPU(s) 605. The GPU(s) 605 may comprise processing units specialized for but not necessarily limited to highly parallel computations, such as graphics and other visualization-related processing.

A chipset 606 may provide an interface between the CPU(s) 604 and the remainder of the components and devices on the baseboard. The chipset 606 may provide an interface to a random access memory (RAM) 608 used as the main memory in the computing device 600. The chipset 606 may further provide an interface to a computer-readable storage medium, such as a read-only memory (ROM) 620 or non-volatile RAM (NVRAM) (not shown), for storing basic routines that may help to start up the computing device 600 and to transfer information between the various components and devices. ROM 620 or NVRAM may also store other software components necessary for the operation of the computing device 600 in accordance with the aspects described herein.

The computing device 600 may operate in a networked environment using logical connections to remote computing nodes and computer systems through local area network (LAN) 616. The chipset 606 may include functionality for providing network connectivity through a network interface controller (NIC) 622, such as a gigabit Ethernet adapter. A NIC 622 may be capable of connecting the computing device 600 to other computing nodes over a network 616. It should be appreciated that multiple NICs 622 may be present in the computing device 600, connecting the computing device to other types of networks and remote computer systems.

The computing device 600 may be connected to a mass storage device 628 that provides non-volatile storage for the computer. The mass storage device 628 may store system programs, application programs, other program modules, and data, which have been described in greater detail herein. The mass storage device 628 may be connected to the computing device 600 through a storage controller 624 connected to the chipset 606. The mass storage device 628 may consist of one or more physical storage units. A storage controller 624 may interface with the physical storage units through a serial attached SCSI (SAS) interface, a serial advanced technology attachment (SATA) interface, a fiber channel (FC) interface, or other type of interface for physically connecting and transferring data between computers and physical storage units.

The computing device 600 may store data on a mass storage device 628 by transforming the physical state of the physical storage units to reflect the information being stored. The specific transformation of a physical state may depend on various factors and on different implementations of this description. Examples of such factors may include, but are not limited to, the technology used to implement the physical storage units and whether the mass storage device 628 is characterized as primary or secondary storage and the like.

For example, the computing device 600 may store information to the mass storage device 628 by issuing instructions through a storage controller 624 to alter the magnetic characteristics of a particular location within a magnetic disk drive unit, the reflective or refractive characteristics of a particular location in an optical storage unit, or the electrical characteristics of a particular capacitor, transistor, or other discrete component in a solid-state storage unit. Other transformations of physical media are possible without departing from the scope and spirit of the present description, with the foregoing examples provided only to facilitate this description. The computing device 600 may further read information from the mass storage device 628 by detecting the physical states or characteristics of one or more particular locations within the physical storage units.

In addition to the mass storage device 628 described herein, the computing device 600 may have access to other computer-readable storage media to store and retrieve information, such as program modules, data structures, or other data. It should be appreciated by those skilled in the art that computer-readable storage media may be any available media that provides for the storage of non-transitory data and that may be accessed by the computing device 600.

By way of example and not limitation, computer-readable storage media may include volatile and non-volatile, transitory computer-readable storage media and non-transitory computer-readable storage media, and removable and non-removable media implemented in any method or technology. Computer-readable storage media includes, but is not limited to, RAM, ROM, erasable programmable ROM ("EPROM"), electrically erasable programmable ROM ("EEPROM"), flash memory or other solid-state memory technology, compact disc ROM ("CD-ROM"), digital versatile disk ("DVD"), high definition DVD ("HD-DVD"), BLU-RAY, or other optical storage, magnetic cassettes, magnetic tape, magnetic disk storage, other magnetic storage devices, or any other medium that may be used to store the desired information in a non-transitory fashion.

A mass storage device, such as the mass storage device 628 depicted in FIG. 6, may store an operating system utilized to control the operation of the computing device 600. The operating system may comprise a version of the LINUX operating system. The operating system may comprise a version of the WINDOWS SERVER operating system from the MICROSOFT Corporation. According to further aspects, the operating system may comprise a version of the UNIX operating system. Various mobile phone operating systems, such as IOS and ANDROID, may also be utilized. It should be appreciated that other operating systems may also be utilized. The mass storage device 628 may store other system or application programs and data utilized by the computing device 600.

The mass storage device 628 or other computer-readable storage media may also be encoded with computer-executable instructions, which, when loaded into the computing device 600, transforms the computing device from a general-purpose computing system into a special-purpose computer capable of implementing the aspects described herein. These computer-executable instructions transform the computing device 600 by specifying how the CPU(s) 604 transition between states, as described herein. The computing device 600 may have access to computer-readable storage media storing computer-executable instructions, which, when executed by the computing device 600, may perform the methods described in relation to FIG. 3.

A computing device, such as the computing device 600 depicted in FIG. 6, may also include an input/output controller 632 for receiving and processing input from a number of input devices, such as a keyboard, a mouse, a touchpad, a touch screen, an electronic stylus, or other type of input device. Similarly, an input/output controller 632 may provide output to a display, such as a computer monitor, a flat-panel display, a digital projector, a printer, a plotter, or other type of output device. It will be appreciated that the computing device 600 may not include all of the components shown in FIG. 6, may include other components that are not explicitly shown in FIG. 6, or may utilize an architecture completely different than that shown in FIG. 6.

As described herein, a computing device may be a physical computing device, such as the computing device 600 of FIG. 6. A computing node may also include a virtual machine host process and one or more virtual machine instances. Computer-executable instructions may be executed by the physical hardware of a computing device indirectly through interpretation and/or execution of instructions stored and executed in the context of a virtual machine.

It is to be understood that the methods and systems described herein are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Components are described that may be used to perform the described methods and systems. When combinations, subsets, interactions, groups, etc., of these components are described, it is understood that while specific references to each of the various individual and collective combinations and permutations of these may not be explicitly described, each is specifically contemplated and described herein, for all methods and systems. This applies to all aspects of this application including, but not limited to, operations in described methods. Thus, if there are a variety of additional operations that may be performed it is understood that each of these additional operations may be performed with any specific embodiment or combination of embodiments of the described methods.

The present methods and systems may be understood more readily by reference to the following detailed description of preferred embodiments and the examples included therein and to the Figures and their descriptions.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium.

More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, may be implemented by computer program instructions. These computer program instructions may be loaded on a general-purpose computer, special-purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that may direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

The various features and processes described herein may be used independently of one another, or may be combined in various ways. All possible combinations and sub-combinations are intended to fall within the scope of this disclosure. In addition, certain methods or process blocks may be omitted in some implementations. The methods and processes described herein are also not limited to any particular sequence, and the blocks or states relating thereto may be performed in other sequences that are appropriate. For example, described blocks or states may be performed in an order other than that specifically described, or multiple blocks or states may be combined in a single block or state. The example blocks or states may be performed in serial, in parallel, or in some other manner. Blocks or states may be added to or removed from the described example embodiments. The example systems and components described herein may be configured differently than described. For example, elements may be added to, removed from, or rearranged compared to the described example embodiments.

It will also be appreciated that various items are illustrated as being stored in memory or on storage while being used, and that these items or portions thereof may be transferred between memory and other storage devices for purposes of memory management and data integrity. Alternatively, in other embodiments, some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application-specific integrated circuits ("ASICs"), standard integrated circuits, controllers (e.g., by executing appropriate instructions, and including microcontrollers and/or embedded controllers), field-programmable gate arrays ("FPGAs"), complex programmable logic devices ("CPLDs"), etc. Some or all of the modules, systems, and data structures may also be stored (e.g., as software instructions or structured data) on a computer-readable medium, such as a hard disk, a memory, a network, or a portable media article to be read by an appropriate device or via an appropriate connection. The systems, modules, and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its operations be performed in a specific order. Accordingly, where a method claim does not actually recite an order to be followed by its operations or it is not otherwise specifically stated in the claims or descriptions that the operations are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

It will be apparent to those skilled in the art that various modifications and variations may be made without departing from the scope or spirit of the present disclosure. Other embodiments will be apparent to those skilled in the art from consideration of the specification and practices described herein. It is intended that the specification and example figures be considered as exemplary only, with a true scope and spirit being indicated by the following claims.

The invention claimed is:

1. A method comprising:

splitting first audio content into a plurality of bands, wherein the plurality of bands are associated with a corresponding plurality of decibel ranges;

causing, based on stored information indicating one or more acceptable decibel ranges, an adjustment to at least one band of the plurality of bands, wherein the adjustment amplifies at least one decibel range, of the plurality of decibel ranges, that is below a level; and generating second audio content comprising the adjusted at least one band.

2. The method of claim 1, wherein the adjustment comprises at least one of: dynamic range compression or normalization.

3. The method of claim 1, further comprising:

sending, to a computing device via a content delivery network, information indicating that either the first audio content or the second audio content is selectable for playback by the computing device.

4. The method of claim 1, wherein the one or more acceptable decibel ranges are each associated with a disability type.

5. The method of claim 1, wherein the adjustment is triggered based on detection of advertising content.

6. A non-transitory computer-readable medium storing instructions that, when executed, cause:

splitting first audio content into a plurality of bands, wherein the plurality of bands are associated with a corresponding plurality of decibel ranges;

causing, based on stored information indicating one or more acceptable decibel ranges, an adjustment to at least one band of the plurality of bands, wherein the adjustment amplifies at least one decibel range, of the plurality of decibel ranges, that is below a level; and generating second audio content comprising the adjusted at least one band.

7. The non-transitory computer-readable medium of claim 6, wherein the adjustment comprises at least one of: dynamic range compression or normalization.

8. The non-transitory computer-readable medium of claim 6, wherein the instructions, when executed, further cause:

sending, to a computing device via a content delivery network, information indicating that either the first audio content or the second audio content is selectable for playback by the computing device.

9. The non-transitory computer-readable medium of claim 6, wherein the one or more acceptable decibel ranges are each associated with a disability type.

10. The non-transitory computer-readable medium of claim 6, wherein the adjustment is triggered based on detection of advertising content.

11. A system comprising:

a first computing device configured to:

split first audio content into a plurality of bands, wherein the plurality of bands are associated with a corresponding plurality of decibel ranges, cause, based on stored information indicating one or more acceptable decibel ranges, an adjustment to at least one band of the plurality of bands, wherein the adjustment amplifies at least one decibel range, of the plurality of decibel ranges, that is below a level, and generate second audio content comprising the adjusted at least one band; and a second computing device configured to:

cause output of the second audio content.

12. The system of claim 11, wherein the adjustment comprises at least one of: dynamic range compression or normalization.

13. The system of claim 11, wherein the first computing device is further configured to:

send, to the second computing device via a content delivery network, information indicating that either the first audio content or the second audio content is selectable for playback by the second computing device.

14. The system of claim 11, wherein the one or more acceptable decibel ranges are each associated with a disability type.

15. The system of claim 11, wherein the adjustment is triggered based on detection of advertising content.

16. A method comprising:

receiving a video stream comprising first audio content;

splitting first audio content into a plurality of decibel ranges; and creating, based on stored information indicating one or more acceptable decibel ranges, second audio content comprising an adjustment to at least one decibel range of the plurality of decibel ranges, wherein the adjustment comprises an amplification of the at least one decibel range, of the plurality of decibel ranges, that is below a level.

17. The method of claim 16, wherein the adjustment comprises at least one of: dynamic range compression or normalization.

18. The method of claim 16, further comprising:

sending, to a computing device via a content delivery network, information indicating that either the first audio content or the second audio content is selectable for playback by the computing device.

19. The method of claim 16, wherein the one or more acceptable decibel ranges are each associated with a disability type.

20. The method of claim 16, wherein the adjustment is triggered based on detection of advertising content.

* * * * *